(12) United States Patent
Kim et al.

(10) Patent No.: US 12,166,137 B2
(45) Date of Patent: Dec. 10, 2024

(54) ALIGNED METALLIZATION FOR SOLAR CELLS

(71) Applicant: Maxeon Solar Pte. Ltd., Singapore (SG)

(72) Inventors: Taeseok Kim, Pleasanton, CA (US); David Smith, Campbell, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/239,636

(22) Filed: Aug. 29, 2023

(65) Prior Publication Data

US 2023/0411538 A1 Dec. 21, 2023

Related U.S. Application Data

(62) Division of application No. 17/116,472, filed on Dec. 9, 2020, now Pat. No. 11,824,126.

(Continued)

(51) Int. Cl.
*H01L 31/02* (2006.01)
*H01L 31/0216* (2014.01)
*H01L 31/18* (2006.01)

(52) U.S. Cl.
CPC .. *H01L 31/02008* (2013.01); *H01L 31/02168* (2013.01); *H01L 31/186* (2013.01)

(58) Field of Classification Search
CPC ......... H01L 31/02008; H01L 31/02168; H01L 31/186; H01L 31/0747; H01L 31/0745;

(Continued)

(56) References Cited

U.S. PATENT DOCUMENTS 8,679,889 B2 3/2014 Cousins et al.
9,312,406 B2 4/2016 Loscutoff et al.
(Continued)

FOREIGN PATENT DOCUMENTS

CN 103904138 A 7/2014
JP 2009/021494 A 1/2009
(Continued)

OTHER PUBLICATIONS

WO-2013161145-A1 English machine translation (Year: 2013).*
(Continued)

*Primary Examiner* — Andrew J Golden
(74) *Attorney, Agent, or Firm* — Schwabe, Williamson & Wyatt, P.C.

(57) ABSTRACT

Aligned metallization approaches for fabricating solar cells, and the resulting solar cells, are described. In an example, a solar cell includes a semiconductor layer over a semiconductor substrate. A first plurality of discrete openings is in the semiconductor layer and exposes corresponding discrete portions of the semiconductor substrate. A plurality of doped regions is in the semiconductor substrate and corresponds to the first plurality of discrete openings. An insulating layer is over the semiconductor layer and is in the first plurality of discrete openings. A second plurality of discrete openings is in the insulating layer and exposes corresponding portions of the plurality of doped regions. Each one of the second plurality of discrete openings is entirely within a perimeter of a corresponding one of the first plurality of discrete openings. A plurality of conductive contacts is in the second plurality of discrete openings and is on the plurality of doped regions.

10 Claims, 7 Drawing Sheets

Related U.S. Application Data

(60) Provisional application No. 62/946,396, filed on Dec. 10, 2019.

(58) Field of Classification Search
CPC ......... H01L 31/0682; H01L 31/022433; H01L 31/022441
See application file for complete search history.

(56) References Cited

U.S. PATENT DOCUMENTS

| | | |
|---|---|---|
| 9,466,750 B2 | 10/2016 | Cousins et al. |
| 9,548,409 B2 | 1/2017 | Cousins |
| 9,564,551 B2 | 2/2017 | Loscutoff et al. |
| 9,634,177 B2 | 4/2017 | Rim et al. |
| 10,170,657 B2 | 1/2019 | Swanson et al. |
| 2006/0130891 A1 | 6/2006 | Carlson |
| 2008/0224249 A1 | 9/2008 | Nabe et al. |
| 2010/0218821 A1 | 9/2010 | Kim et al. |
| 2014/0151724 A1 | 6/2014 | Hermann |
| 2014/0166095 A1 | 6/2014 | Loscutoff et al. |
| 2014/0190561 A1 | 7/2014 | De Ceuster et al. |
| 2014/0338747 A1 | 11/2014 | Choi et al. |
| 2015/0140721 A1 | 5/2015 | Moslehi et al. |
| 2017/0062351 A1 | 3/2017 | Von Malm et al. |
| 2018/0097131 A1 | 4/2018 | Rim et al. |

FOREIGN PATENT DOCUMENTS

| | | | |
|---|---|---|---|
| JP | 2013/529853 | 7/2013 | |
| JP | 2014/504003 A | 2/2014 | |
| JP | 2015/095644 A | 5/2015 | |
| JP | 2015/531550 A | 11/2015 | |
| JP | 6266176 B | 1/2018 | |
| JP | 2018-088453 | 6/2018 | |
| KR | 10-2011-0049669 | 5/2011 | |
| WO | WO 2011/132744 A1 | 10/2011 | |
| WO | WO-2013161145 A1 * | 10/2013 | ..... H01L 31/022441 |

OTHER PUBLICATIONS

International Search Report and Written Opinion from PCT/US2020/064204 dated Mar. 26, 2021, 9 pgs.
First Action Interview Pre-Interview Communication from U.S. Appl. No. 17/116,472 dated Feb. 24, 2022, 6 pgs.
First Action Interview from U.S. Appl. No. 17/116,472 dated May 23, 2022, 4 pgs.
International Preliminary Report on Patentability from PCT/US2020/064204 dated Jun. 23, 2022, 6 pgs.
Final Office Action from U.S. Appl. No. 17/116,472 dated Oct. 27, 2022, 18 pgs.
Non-Final Office Action from U.S. Appl. No. 17/116,472 dated Feb. 28, 2023, 14 pgs.
Notice of Rejection from Japanese Patent Application No. 2022-535840 dated Jun. 29, 2023, 7 pgs.

* cited by examiner

ALIGNED METALLIZATION FOR SOLAR CELLS

CROSS-REFERENCE TO RELATED APPLICATIONS

This application is a divisional of U.S. patent application Ser. No. 17/116,472 filed on Dec. 9, 2020, which claims the benefit of U.S. Provisional Application No. 62/946,396 filed on Dec. 10, 2019, the entire contents of which are hereby incorporated by reference herein.

TECHNICAL FIELD

Embodiments of the present disclosure are in the field of renewable energy and, in particular, include aligned metallization approaches for fabricating solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

DETAILED DESCRIPTION

Figure 1:
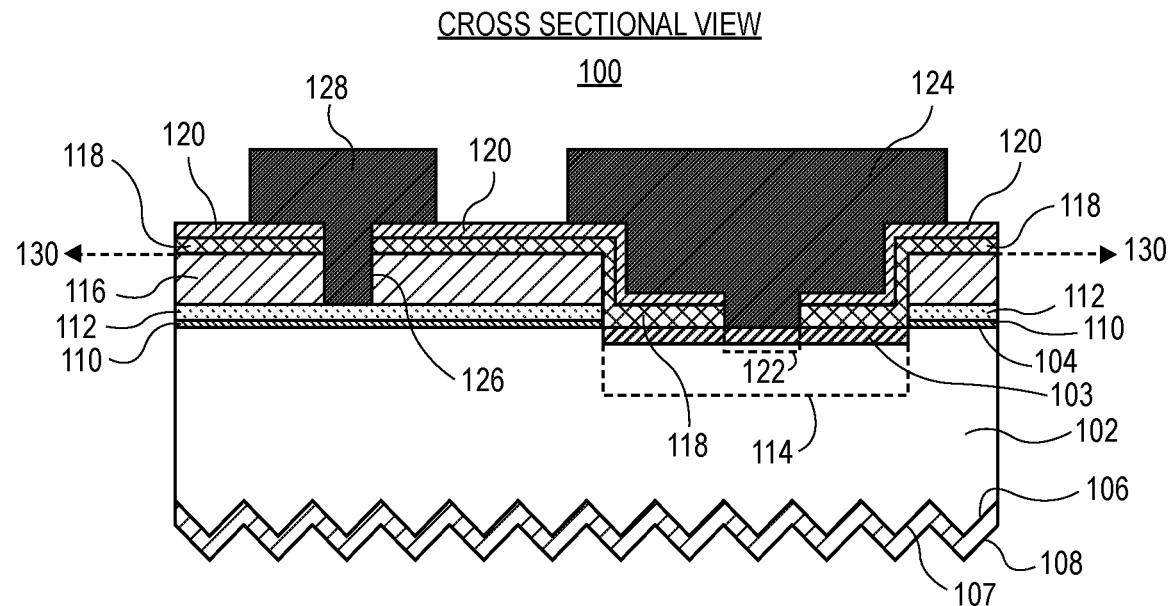
FIG. 1 illustrates a cross-sectional view and corresponding plan view of a solar cell having aligned metallization, in accordance with an embodiment of the present disclosure.
Figure 1:
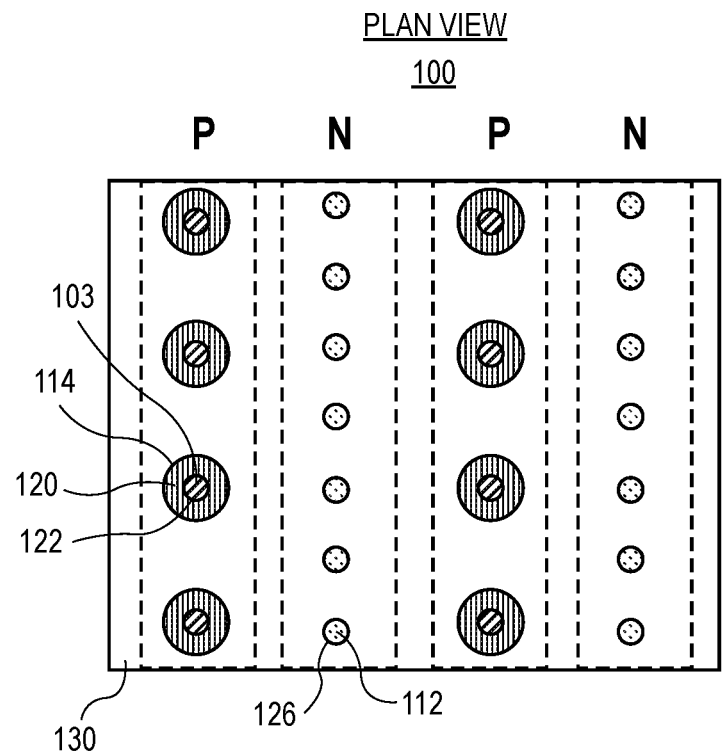

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment." do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Comprising" is open-ended term does not foreclose additional structure or steps.

"Configured to" connotes structure by indicating that a device, such as a unit or a component, includes structure that performs a task or tasks during operation, such structure is configured to perform the task even when the device is not currently operational (e.g., is not on/active). A device "configured to" perform one or more tasks is expressly intended to not invoke a means or step plus function interpretations under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell in a sequence; instead the term "first" is used to differentiate this solar cell from another solar cell (e.g., a "second" solar cell).

"Coupled" refers to elements, features, structures or nodes unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Doped regions," "semiconductor regions," and similar terms describe regions of a semiconductor disposed in, on, above or over a substrate. Such regions can have an N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and inhibit light reflectivity. An intervening layer can be several layers, for example a stack of intervening layers. In some contexts, the insulating layer can be interchanged with a tunneling dielectric layer, while in others the insulating layer is a masking layer or an "antireflective coating layer" (ARC layer). Exemplary materials include silicon nitride, silicon oxynitride, silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials. In an example, the intervening layer can include a material that can act as a moisture barrier. Also, for example, the insulating material can be a passivation layer for a solar cell.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Aligned metallization approaches for fabricating solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure can be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a semiconductor layer over a semiconductor substrate. A first plurality of discrete openings is in the semiconductor layer and exposes corresponding discrete portions of the semiconductor substrate. A plurality of doped regions is in the semiconductor substrate and corresponds to the first plurality of discrete openings. An insulating layer is over the semiconductor layer and is in the first plurality of discrete openings. A second plurality of discrete openings is in the insulating layer and exposes corresponding portions of the plurality of doped regions. Each one of the second plurality of discrete openings is entirely within a perimeter of a corresponding one of the first plurality of discrete openings. A plurality of conductive contacts is in the second plurality of discrete openings and is on the plurality of doped regions.

Also disclosed herein are methods of fabricating solar cells. In one embodiment, a method of fabricating a solar cell includes forming a first plurality of discrete openings in a semiconductor layer above a substrate. The method also includes forming an insulating layer in the first plurality of discrete openings. The method also includes forming a second plurality of discrete openings in the insulating layer using a laser ablation process. Each one of the second plurality of discrete openings is entirely within a perimeter of a corresponding one of the first plurality of discrete openings.

In an embodiment, a method of fabricating a solar cell includes forming a semiconductor layer over a semiconductor substrate. The method also includes forming an insulating layer over the semiconductor layer. The method also includes forming a first plurality of discrete openings in the insulating layer and in the semiconductor layer, the first plurality of discrete openings exposing corresponding discrete portions of the semiconductor substrate. The method also includes forming a doping source layer over the insulating layer and in the first plurality of discrete openings. The method also includes forming a plurality of doped regions in the semiconductor substrate corresponding to the first plurality of discrete openings, the plurality of doped regions formed from the doping source layer. The method also includes forming a second plurality of discrete openings in the doping source layer using a laser ablation process, each one of the second plurality of discrete openings entirely within a perimeter of a corresponding one of the first plurality of discrete openings. The method also includes forming a plurality of conductive contacts in the second plurality of discrete openings and on the plurality of doped regions.

Thus, one or more embodiments described herein can be implemented to provide a method and architecture for a high efficiency and low cost solar cell with maximized high lifetime passivation area by precisely aligning conducting holes on spatially confined emitter regions. According to embodiments, aligned metallization structures can be used to fabricate conductive contacts for an interdigitated back contact (IBC) solar cell architecture.

To provide context, in a first aspect, a state-of-the-art approach to reduce a total number of process operations but maintain the high cell efficiency is by situating a lower lifetime P-type polycrystalline silicon layer (P-poly) on top of an N-type polycrystalline layer (N-poly) for very confined regions, using either screen printing or selective laser ablation mask processes. In such an architecture, there is no constraint to have a P+ emitter region be continuously in contact to a silicon (Si) substrate. A selective laser ablation mask process is used for the P-poly (or lower lifetime polarity emitter) to minimize the P-poly coverage. The contact formation involves laser ablation, and, since the metal layer is required to have certain large area coverage for maximum current collection, there can be an associated risk of having current leaking (or shunting) between a P finger metal and the N-poly under the P-poly. This can particularly be the case around an area hit by a laser during the contact formation process.

In a second aspect, a state-of-the-art approach to reduce a total number of process operations but maintain the high cell efficiency is to combine a low lifetime p++ c-Si emitter region with a high lifetime N-poly emitter, by reducing the p+ area as small as possible, ideally lower than 2% of wafer coverage. Since such an approach can involve using a screen printing or an ink-jet printing, it can be difficult to achieve less than 8% wafer coverage, which can limit reachable cell efficiency of such an architecture.

In accordance with one or more embodiments of the present disclosure, a high efficiency solar cell with a spatially confined emitter region and with a spatially aligned conducting hole is described. Such a structure can be fabricated by depositing or fabricating a first emitter region (e.g., N$^+$ poly Si) with superior surface passivation, followed by an insulating (e.g., SiNx, SiOx, and SiONx) layer deposition. Selective removal of the first emitter from spatially confined regions, for example, a row of dots, squares, or rectangles can then be performed with total area coverage of less than 2% of the wafer. In one example, although dots, squares, or rectangles are disclosed, any shape can be used such as oblong, triangular, trapezoidal, polygon, oval shape and/or any other type of shapes can be used. The individual size (diameter or length) of each feature, for example, can be less than 100 μm. In some examples, the individual size (diameter or length) of each feature, for example, can be less than 150 μm. A second emitter region (e.g., p$^+$ region in a silicon substrate) can then be fabricated by forming a doping layer in locations where the first emitter region is removed and then driving dopants from the doping layer into the substrate. A second insulating dielectric layer (e.g., SiOx, SiNx, or SiONx) can be formed on top of the doping layer. Selective removal of portions of the second insulating layer is performed by aligning directly on top of the spatially confined doping layer (and underlying doped "second emitter" region) for a second emitter polarity finger, and on top of the first emitter for a first emitter polarity finger. In one embodiment, the contact hole on the second emitter region is less than the size of the emitter regions to avoid shunting between the different polarities. In an example as described above, the first emitter region can include a n+ polysilicon, where the second emitter region can include a p+ region in a silicon substrate. In another example, the first emitter region can include a p+ polysilicon, where the second emitter region can include a n+ region in a silicon substrate.

As an exemplary structure, FIG. 1 illustrates a cross-sectional view and corresponding plan view of a solar cell having aligned metallization, in accordance with an embodiment of the present disclosure. The plan view is taken through the axis 130 noting that the structures 128 and 124 are removed from the plan view in order to depict openings beneath the structures 128 and 124.

Referring to FIG. 1, a solar cell 100 includes a substrate 102, such as a monocrystalline silicon substrate. The substrate 102 has a back side 104 and a front side 106, the front side 106 opposite the back side 104. In some embodiments, the front side 106 can be referred to as a front surface and the back side 104 can be referred to as a back surface. In an embodiment, the front side can have a texturized surface 107. A texturized surface can be one which has a regular or an irregular shaped surface for scattering incoming light, decreasing the amount of light reflected off the light-receiving and/or exposed surfaces of the solar cell 100. An anti-reflective coating layer 108 can be conformal with the texturized surface 107, as is depicted.

Referring again to FIG. 1, a semiconductor layer 112 is over the substrate 102. A first plurality of discrete openings 114 is in the semiconductor layer 112 and exposes corresponding discrete portions 103 of the semiconductor substrate 102. A plurality of doped regions (shown as shaded 103) is in the semiconductor substrate 102 and corresponds to the first plurality of discrete openings 114. An insulating layer 118 is over the semiconductor layer 112 and is in the first plurality of discrete openings 114. A second plurality of discrete openings 122 is in the insulating layer 118 and exposes corresponding portions of the plurality of doped regions 103. In an embodiment, as is depicted, each one of the second plurality of discrete openings 122 is within and/or entirely within a perimeter of a corresponding one of the first plurality of discrete openings 114. A plurality of conductive contacts 124 is in the second plurality of discrete openings 122 and is on the plurality of doped regions 103. Although a plurality of discrete openings are shown, in another embodiment, non-discrete openings can also be used and such embodiments are described in FIG. 6 below.

In an embodiment, as is depicted, solar cell 100 further includes a third plurality of discrete openings 126 in the insulating layer 118. The third plurality of discrete openings 126 exposes corresponding discrete portions of the semiconductor layer 112. A second plurality of conductive contacts 128 is in the third plurality of discrete openings 126 and on the corresponding discrete portions of the semiconductor layer 112. In one embodiment, as is depicted, the plurality of conductive contacts 124 (and, hence the second plurality of discrete openings 122) is a first unidirectional row of conductive contacts. The second plurality of conductive contacts 128 (and, hence, the third plurality of discrete openings 126) is a second unidirectional row of conductive contacts 128 parallel with the first unidirectional row of conductive contacts 124. It is to be appreciated that two rows of each are shown as alternating in the plan view of FIG. 1.

In an embodiment, as is depicted, the semiconductor layer 112 is on a thin dielectric layer 110 on the substrate 102. The first plurality of discrete openings 114 is further in the thin dielectric layer 110. In an example, the thin dielectric layer 110 can be a thin oxide layer such as a tunnel dielectric layer (e.g., tunnel oxide, silicon oxynitride, silicon oxide). In an embodiment, the thin dielectric layer 110 can have a thickness of approximately 2 nanometers or less.

In an embodiment, the semiconductor layer 112 can be a polycrystalline silicon layer. In an embodiment, the semiconductor layer 112 can include a first conductivity type. In an example, semiconductor layer 112 can be a first polycrystalline silicon layer of a first conductivity type. In a specific embodiment, the first conductivity type is N-type (e.g., formed using phosphorus or arsenic impurity atoms). In another specific embodiment, the first conductivity type is P-type (e.g., formed using boron impurity atoms). In some embodiments, first semiconductor layer is a pre-doped polycrystalline silicon layer. In one such embodiment, the first semiconductor layer is formed having a specific conductivity type (e.g., n-type or p-type).

In an embodiment, the insulating layer 118 is a doping source layer. As is depicted, the solar cell 100 further includes a second insulating layer 116 between the semiconductor layer 112 and the doping source layer (118). The first plurality of discrete openings 114 is further in the second insulating layer 116. In one such embodiment, as is depicted, the solar cell 100 further includes an anti-reflective coating layer 120 over the doping source layer (118). The second plurality of discrete openings 114 is further in the anti-reflective coating layer 120. In an example, the anti-reflective coating layer 120 can include a silicon nitride layer.

In an embodiment, the doping source layer (118) can have a second conductivity type. In an embodiment, the doping source layer (118) is of the opposite conductivity type as the semiconductor layer 112. In an example, the doping source layer (118) is P-type (e.g., formed using boron atoms). In another example, the doping source layer (118) is N-type (e.g., formed using phosphorus atoms or arsenic impurity atoms).

In an embodiment, the semiconductor layer 112 has a first conductivity type, and the plurality of doped regions 103 has a second conductivity type opposite the first conductivity type. In one such embodiment, the semiconductor layer 112 is N-type, and the plurality of doped regions 103 is P-type, providing the PNPN arrangement depicted in the plan view of FIG. 1. In another embodiment, the semiconductor layer 112 is P-type, and the plurality of doped regions 103 is N-type providing for, in one example, an alternative the NPNP arrangement to that shown in FIG. 1.

In some embodiments, the conductive contacts 124 and 128 can include a plated metal. In an example, the conductive contacts 124 and 128 can include plated copper, tin, titanium, tungsten, and/or nickel, among other metals.

In some embodiments, the conductive contacts 124 and 128 can include a deposited metal. In an embodiment, the deposited metal can be an aluminum-based. In one such embodiment, the aluminum-based deposited metal can have a thickness approximately in the range of 0.3 to 20 microns and include aluminum in an amount greater than approximately 97% and silicon in an amount approximately in the range of 0-2%. In an example, the aluminum-based deposited metal can include copper, titanium, titanium tungsten, nickel, and/or aluminum, among other metals. In an embodiment, the aluminum-based deposited metal is formed from a blanket deposition process. In an embodiment, the aluminum-based deposited metal can be a metal seed layer. In some examples, the deposited metal can be a deposited aluminum. In one embodiment, a conductive contact as described herein can include copper, tin, nickel, and/or aluminum, among other metals.

In some embodiments, the conductive contacts 124 and 128 can include a metal foil. In an example, the conductive contacts 124 and 128 can include aluminum or aluminum foil. In an embodiment, the metal foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In another embodiment, the aluminum foil is not anodized.

In some embodiments, the conductive contacts 124 and 128 can include a conductive wire. In an embodiment, the conductive wire can include an electrically conducting material (e.g., a metal such as aluminum, copper or another suitable conductive material, with or without a coating such as tin, silver, nickel or an organic solderability protectant). In an example, the conductive wires can be bonded to a semiconductor region by a thermocompression bonding, ultrasonic bonding, or thermosonic bonding process. In one example, the conductive wires can be bonded to a metal seed or metal paste material on a semiconductor region.

Figure 2A:
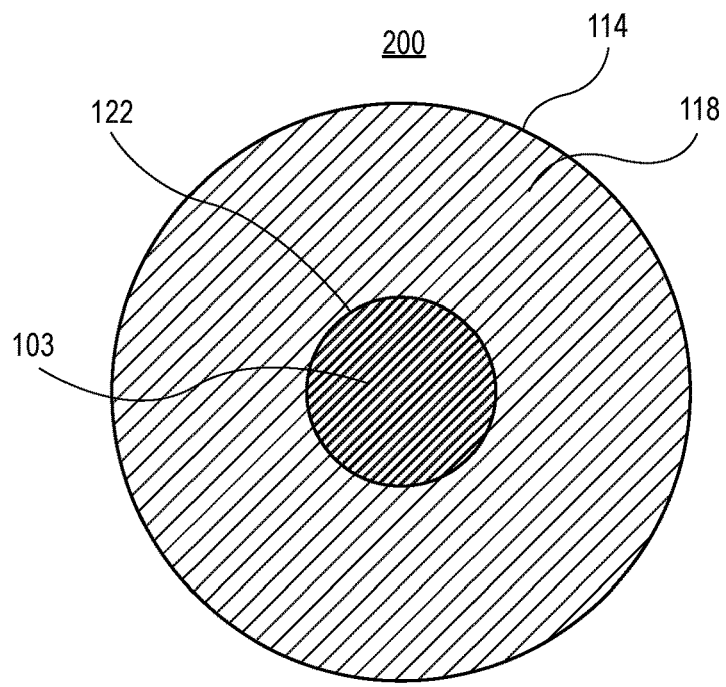
FIG. 2A illustrates a plan view of an opening for forming a metallization structure of a solar cell, in accordance with another embodiment of the present disclosure.

In an embodiment, each of the first plurality of discrete openings 114 is approximately circular, and each of the second plurality of discrete openings 122 is approximately circular, as is depicted in the plan view of FIG. 1 and in FIG. 2A, where FIG. 2A illustrates a plan view of an opening for forming a metallization structure of a solar cell, in accordance with another embodiment of the present disclosure.

It is to be appreciated, however, that the shape of openings of either of or both of the first plurality of discrete openings 114 and the second plurality of discrete openings 122 need not be circular. The shape of openings of either of or both of the first plurality of discrete openings 114 and the second plurality of discrete openings 122 can be an arbitrary shape as long as the total small area and the alignment requirement (e.g., the second openings are within and/or entirely within the first openings) is met. In an example, the shape of openings of either of or both of the first plurality of discrete openings 114 and the second plurality of discrete openings 122 can be square, rectangular, or oval shape, etc.

In an embodiment, one or more of the second plurality of discrete openings 122 is centered within a perimeter of a corresponding one or more of the first plurality of discrete openings 114, as is depicted in the plan view of FIG. 1 and in FIG. 2A. In another embodiment, however, one or more of the second plurality of discrete openings 122 is off-center within a perimeter of a corresponding one or more of the first plurality of discrete openings 114. As an example, FIG. 2B illustrates a plan view of a plurality of openings for forming a plurality of metallization structures of a solar cell, in accordance with another embodiment of the present disclosure.

Figure 2B:
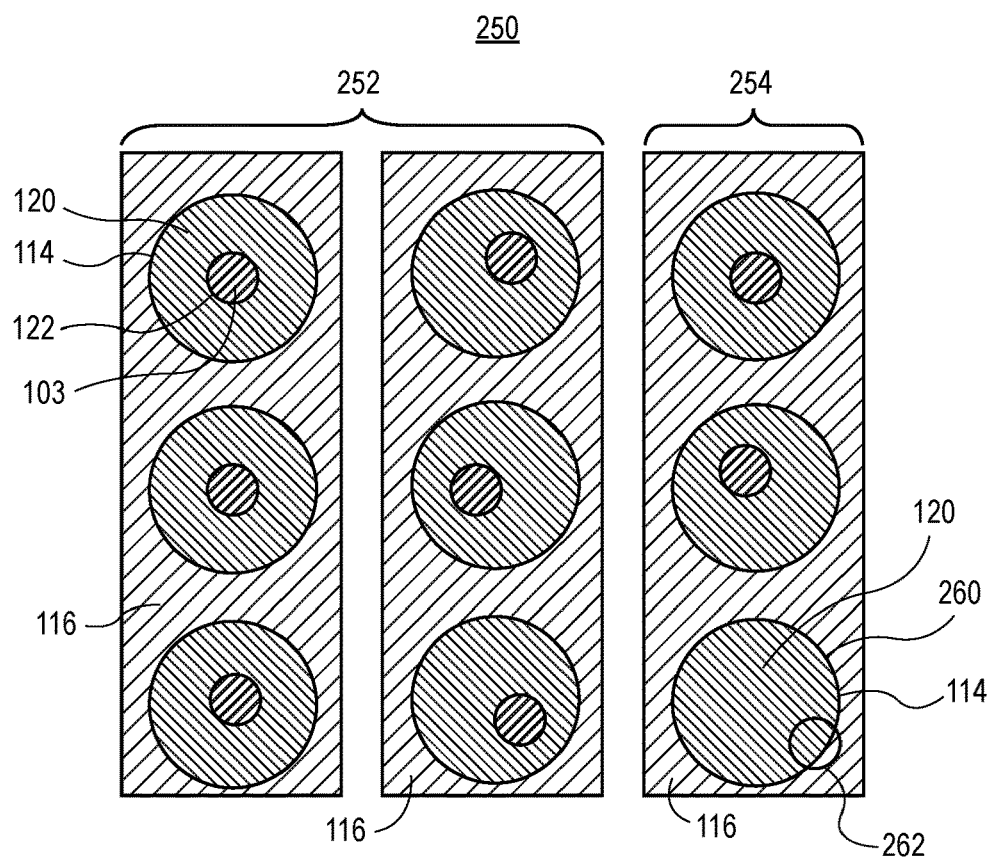
FIG. 2B illustrates a plan view of a plurality of openings for forming a plurality of metallization structures of a solar cell, in accordance with another embodiment of the present disclosure.

Referring to FIG. 2B, the left and right columns of openings of 252 are off-center but still acceptable since the second plurality of discrete openings 122 is entirely within a perimeter of a corresponding one or more of the first plurality of discrete openings 114. The left column of openings of 252 is slightly off-center, and the right column of openings of 252 is more off-center. On the other hand, the column of openings of 254 are not acceptable since the bottom discrete opening 262 is not entirely within a perimeter of the corresponding discrete opening 114.

Figure 3:
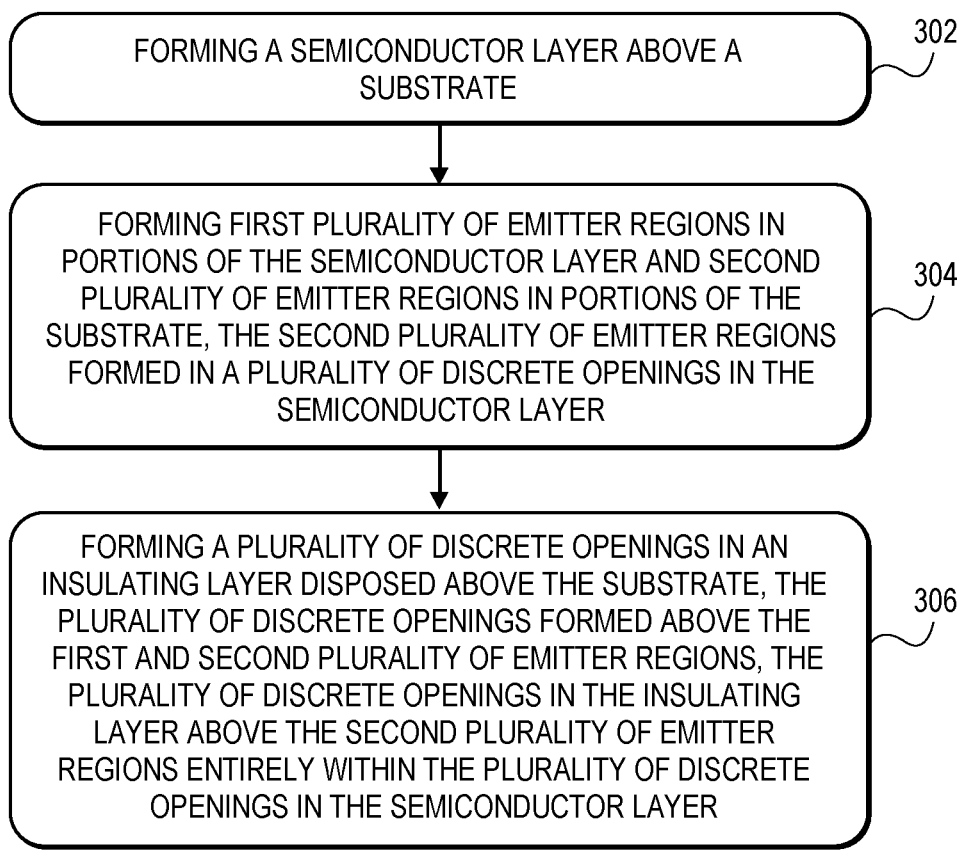
FIG. 3 is a flowchart including various operations in a method of fabricating a solar cell having aligned metallization, in accordance with an embodiment of the present disclosure.

FIG. 3 is a flowchart including various operations in a method of fabricating a solar cell having aligned metallization, in accordance with an embodiment of the present disclosure.

Referring to flowchart 300 of FIG. 3, at operation 302, a semiconductor layer is formed above a substrate. In an embodiment, the semiconductor layer can be a polycrystalline silicon layer. In an example, the semiconductor layer can be a P-type or an N-type polycrystalline silicon layer.

In one embodiment, at operation 304, a first plurality of emitter regions is formed in portions of the semiconductor layer and second plurality of emitter regions is formed in portions of the substrate, the second plurality of emitter regions formed in a plurality of discrete openings in the semiconductor layer. In an embodiment, the first plurality of emitter regions can include doped regions in the semiconductor layer. In an embodiment, the second plurality of emitter regions can include doped regions in the substrate. In an embodiment, the plurality of discrete openings in the semiconductor layer are formed using a laser ablation process, which can be accompanied by a subsequent etch process. In one embodiment, the first plurality of discrete openings is formed using a screen print etch process.

In one embodiment, at operation 306, a plurality of discrete openings are formed in an insulating layer disposed above the substrate, the plurality of discrete openings formed above the first and second plurality of emitter regions. In an embodiment, the plurality of discrete openings in the insulating layer formed above second plurality of emitter regions, are formed entirely within the plurality of discrete openings in the semiconductor layer (e.g., from operation 304). In an embodiment, plurality of discrete openings in the insulating layer formed above second plurality of emitter regions, are formed entirely within a perimeter of a corresponding one of the plurality of discrete openings in the semiconductor layer. In one embodiment, at operation 306, forming the plurality of discrete openings in the insulating layer includes forming one or more of the plurality of discrete openings centered within a perimeter of a corresponding one or more of the plurality of discrete openings in the semiconductor layer. In one embodiment, at operation 306, forming the plurality of discrete openings in the insulating layer includes forming one or more of the plurality of discrete openings in the insulating layer off-center within a perimeter of a corresponding one or more of the plurality of discrete openings in the semiconductor layer.

Figure 4:
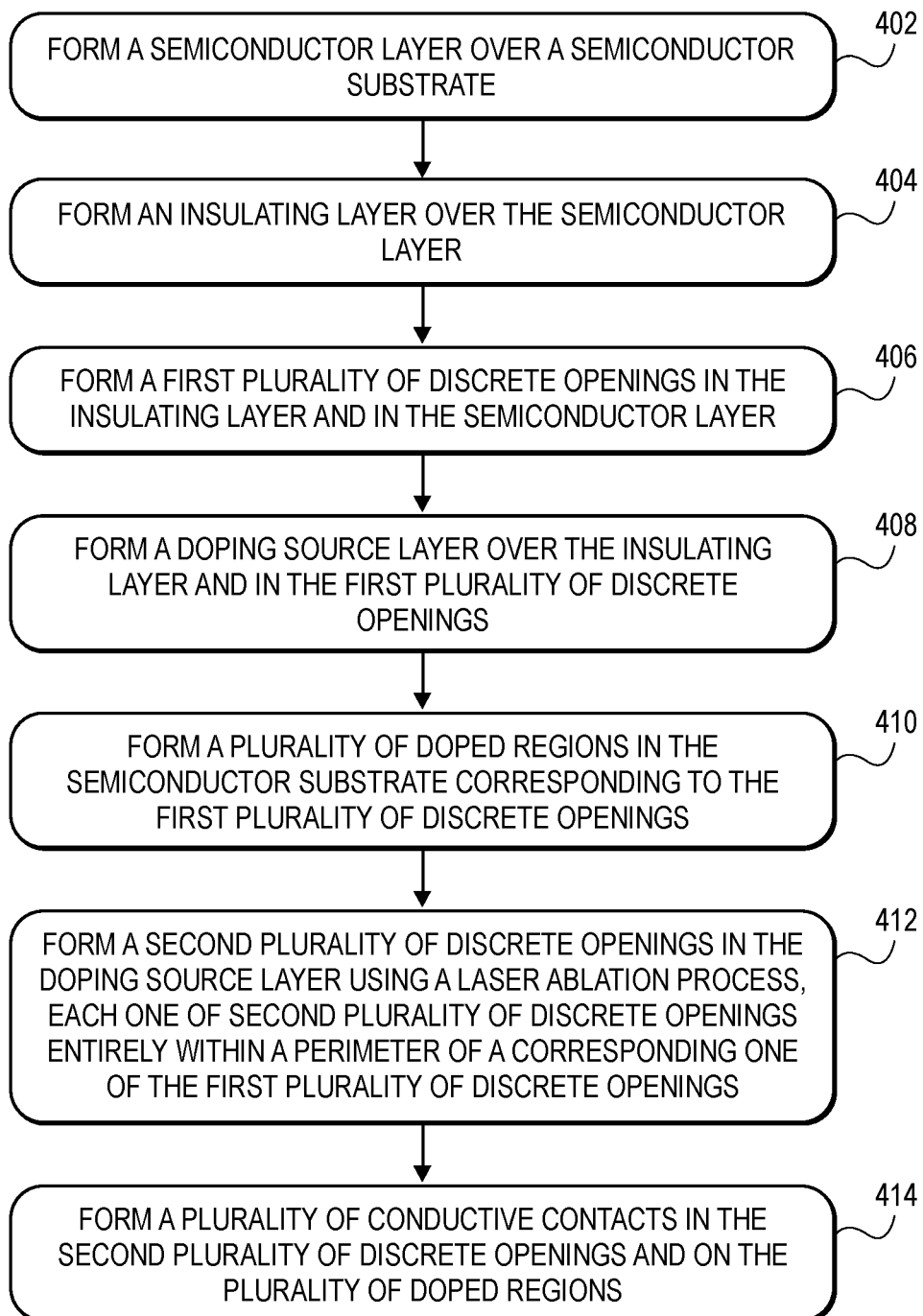
FIG. 4 is a flowchart including various operations in another method of fabricating a solar cell having aligned metallization, in accordance with another embodiment of the present disclosure.

FIG. 4 is a flowchart including various operations in another method of fabricating a solar cell having aligned metallization, in accordance with another embodiment of the present disclosure.

Referring to flowchart 400 of FIG. 4, at operation 402, a semiconductor layer over a semiconductor substrate. At operation 404, an insulating layer is formed over the semiconductor layer. At operation 406, a first plurality of discrete openings is formed in the insulating layer and in the semiconductor layer. The first plurality of discrete openings exposes corresponding discrete portions of the semiconductor substrate. At operation 408, a doping source layer is formed over the insulating layer and in the first plurality of discrete openings. At operation 410, a plurality of doped regions is formed in the semiconductor substrate corresponding to the first plurality of discrete openings. The plurality of doped regions can be formed from the doping source layer. At operation 412, a second plurality of discrete openings is formed in the doping source layer using a laser ablation process. At operation 414, a plurality of conductive contacts is formed in the second plurality of discrete openings and on the plurality of doped regions.

In an embodiment, prior to, subsequent to, or at the same time as performing operation 414, the method further includes forming a third plurality of discrete openings in the doping source layer and the insulating layer. The third plurality of discrete openings exposes corresponding discrete portions of the semiconductor layer. A second plurality of conductive contacts is formed in the third plurality of discrete openings and on the corresponding discrete portions of the semiconductor layer.

In one embodiment, at operation 406, the first plurality of discrete openings is formed using a laser ablation process, which can be accompanied by a subsequent etch process. In one embodiment, at operation 406, the first plurality of discrete openings is formed using a screen print etch process.

In one embodiment, at operation 414, each one of the second plurality of discrete openings is formed entirely within a perimeter of a corresponding one of the first plurality of discrete openings. In one embodiment, at operation 414, forming the second plurality of discrete openings includes forming one or more of the second plurality of discrete openings centered within a perimeter of a corresponding one or more of the first plurality of discrete openings. In one embodiment, at operation 414, forming the second plurality of discrete openings includes forming one or more of the second plurality of discrete openings off-center within a perimeter of a corresponding one or more of the first plurality of discrete openings.

As an exemplary process scheme including a combination of operations described above in association with FIGS. 3 and/or 4, FIGS. 5A-5E illustrate cross-sectional views representing various operations in a method of fabricating a solar cell having aligned metallization, in accordance with an embodiment of the present disclosure.

Figure 5A:
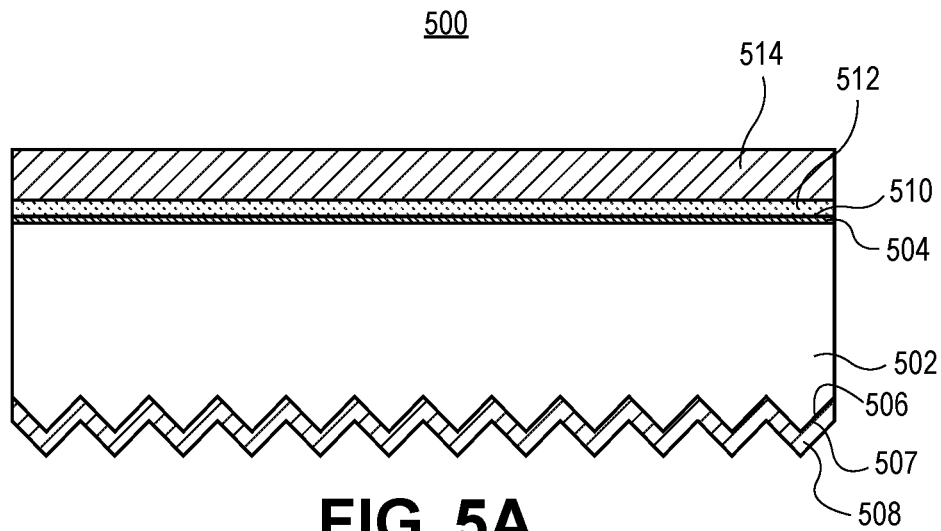
FIGS. 5A-5E illustrate cross-sectional views representing various operations in a method of fabricating a solar cell having aligned metallization, in accordance with an embodiment of the present disclosure.

Referring to FIG. 5A, a starting structure 500 includes a semiconductor substrate 502, such as a monocrystalline silicon substrate. The substrate 502 has a back side 504 and a front side 506, the front side 506 opposite the back side 504. In some embodiments, the front side 506 can be referred to as a front surface and the back side 504 can be referred to as a back surface. In an embodiment, the front side can have a texturized surface 507. A texturized surface 507 can be one which has a regular or an irregular shaped surface for scattering incoming light, decreasing the amount of light reflected off the light-receiving and/or exposed surfaces of the resulting solar cell. An anti-reflective coating layer 508 can be conformal with the texturized surface 107, as is depicted.

A semiconductor layer 512 is formed over the semiconductor substrate 502. An insulating layer 514 is formed over the semiconductor layer 512. In one embodiment, a thin dielectric layer 510 is formed on the semiconductor substrate 502, and the semiconductor layer 512 is formed on the thin dielectric layer 510, as is depicted.

In an embodiment, the texturized surface 507 is formed using a texturization process performed on the front side of the substrate. In an example, a hydroxide-based wet etchant can be used to form a texturized surface on the front side of the substrate. It is to be appreciated, however, that the texturizing of the front side can be omitted from the process flow. In an embodiment, prior to or within the same or a single process operation of the texturization process, the substrate can be cleaned, polished, planarized and/or thinned. In an example, a wet chemical clean process can be performed prior and/or subsequent to the texturization process. Although the texturization process can be performed at the start of the fabrication process, in another embodiment, the texturization process can be performed at another operation in the fabrication process. In an example, the texturization process can instead be performed subsequent to a patterning process. In one example, the texturization process can be performed prior to a thermal process. In one such example, the texturization process can be performed subsequent to a patterning (e.g., patterning of polycrystalline silicon regions) and prior to a thermal process.

In an embodiment, the thin dielectric layer 510 can be formed in an oxidation process and is a thin oxide layer such as a tunnel dielectric layer (e.g., silicon oxide). In one embodiment, the thin dielectric layer 510 can be formed in a deposition process. In an embodiment, the thin dielectric layer 510 is a thin oxide layer or silicon oxynitride layer. In an embodiment, forming the thin dielectric layer 510 can include forming the thin dielectric layer 510 at a thickness of approximately 2 nanometers or less. In an example, a thermal process or oven can be used to grow the thin dielectric layer 510.

In an embodiment, forming the semiconductor layer 512 can include forming a polycrystalline silicon layer. In an embodiment, forming the semiconductor layer 512 can include forming a silicon layer on the thin dielectric layer 510. In an example, forming the silicon layer can include growing an N-type silicon layer over the thin dielectric layer 510. In other embodiments, the silicon layer can be a P-type silicon layer. In an embodiment, the silicon layer is an amorphous silicon layer. In one such embodiment, the amorphous silicon layer is formed using low pressure chemical vapor deposition (LPCVD) or plasma enhanced chemical vapor deposition (PECVD). In an embodiment, the silicon layer can be a polycrystalline silicon. In an embodiment, the silicon layer is grown on the thin dielectric layer 510 in a thermal process and/or an oven. In one embodiment, the thin dielectric layer 510 and the silicon layer can be grown in the same or single oven and/or in the same or single process operation. In another embodiment, the silicon layer can be formed undoped. In one such embodiment, a dopant layer can be formed on the silicon layer and a thermal process can be performed to drive dopants from the dopant layer into the silicon layer resulting in a silicon layer having the second conductivity type (e.g., N-type or P-type).

Figure 5B:
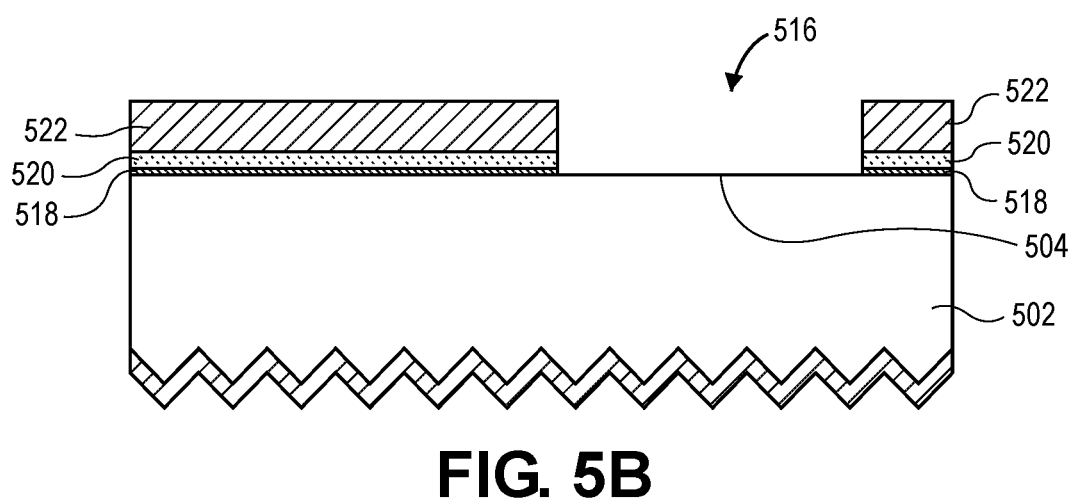

Referring to FIG. 5B, a first discrete opening 516 is formed in the insulating layer 514, in the semiconductor layer 512, and if included, in the thin dielectric layer 510. The first discrete opening 516 exposes a corresponding discrete portion of the semiconductor substrate 502. In an embodiment, the first discrete opening 516 diameter is, for example, less than 70 μm.

In an embodiment, a laser ablation process (e.g., direct write) can be used to form first discrete opening 516. In an example, pulsed (fs-ps range) laser ablation of the insulating layer 514 is performed by using the laser with pulse duration between $10^{-15}$ s and $10^{-7}$ s, with laser wavelengths between 248-535 nm, followed by selective etching of the semiconductor layer 512.

In an embodiment, a lithographic or screen/ink jet print masking and subsequent etch process can be used to form first discrete opening 516. In an example, a mask can be formed and a subsequent wet chemical etching process can be performed to form the contact openings. In some embodiments, a wet chemical cleaning processes can be performed to remove the mask. In an embodiment, any other lithographic process can be used, e.g., an inkjet process, etc. In one embodiment, a combination of the laser ablation process, lithographic (e.g., screen print) and an etching process can be performed to form first discrete opening 516. In an example, forming the first discrete opening 516 can include performing a laser ablation process and etching process (e.g., masking and wet etching process).

Figure 5C:
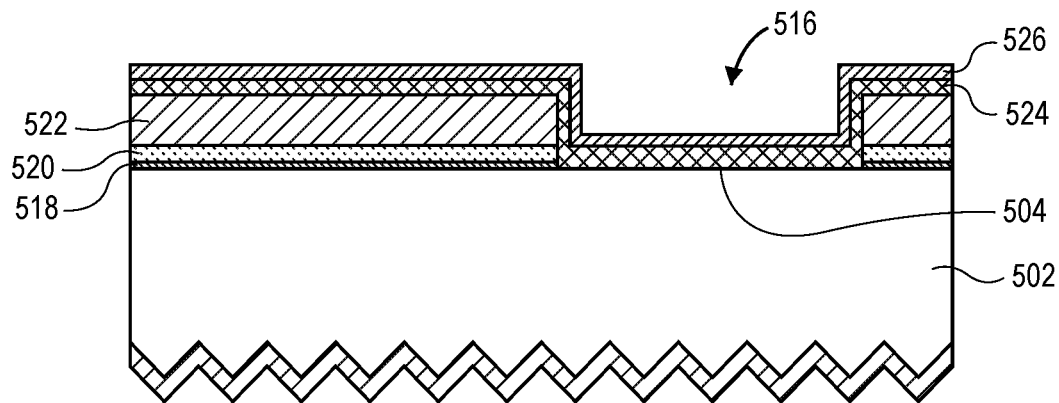

Referring to FIG. 5C, a doping source layer 524 is formed over the insulating layer 514 and in the first discrete opening 516. A doped region can be formed in a region of the semiconductor substrate 502 corresponding to the first discrete opening 516. In one such embodiment, the doped region is formed from the doping source layer 524. In an embodiment, as is depicted, an anti-reflective coating layer 526 is formed over the doping source layer 524.

In an embodiment, a doped region can be formed in a region of the semiconductor substrate 502 by performing a thermal process to drive dopants from the doping source layer 524 to the substrate 502. In an embodiment, the conductivity type of the dopants is P-type, e.g., the dopants are boron dopants. In an example, the thermal process can include heating to a temperature approximately greater than or equal to 900 degrees Celsius to drive dopants from the doping source layer 524 and into portions of substrate 502.

Figure 5D:
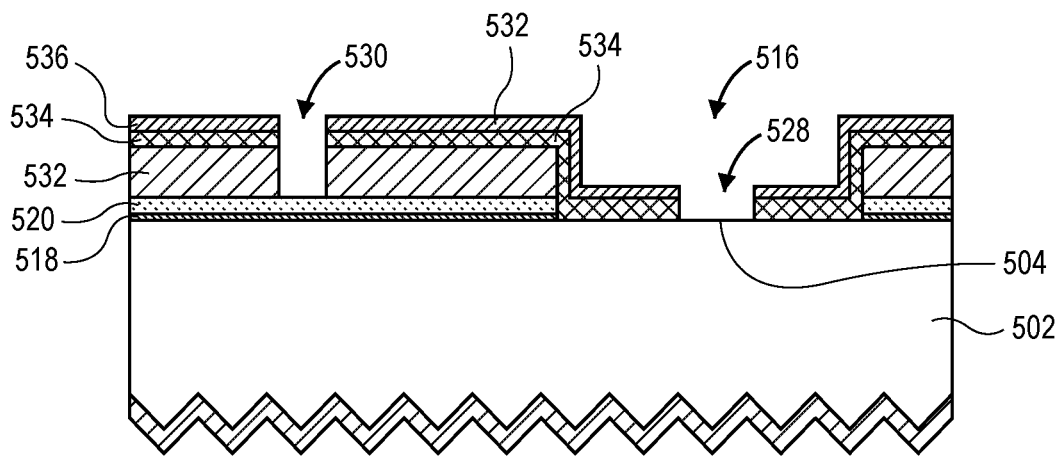

Referring to FIG. 5D, a second discrete opening 528 is formed in the doping source layer 524, and if included, in the anti-reflective coating layer 526. In one embodiment, second discrete opening 528 is formed using a laser ablation process. In some embodiments, second discrete opening 528 is formed using a laser ablation process and an etching process. In an embodiment, prior to, subsequent to, or at the same time as forming the second discrete opening 528, a third discrete opening 530 is formed in the doping source layer 524 and in the insulating layer 514, and if included, in the anti-reflective coating layer 526. The third discrete opening 530 exposes a corresponding discrete portion of the semiconductor layer 512.

In an example, the diameter of the second discrete opening 528 is less than 30 μm. In another example, the diameter of the second discrete opening 528 is about half of the diameter of the first discrete opening 516. In an embodiment, the second discrete opening is formed by first screen/ink jet print of a negative resist for the contacting hole, followed by pulsed (fs-ps range) laser ablation performed by using the laser with pulse duration between $10^{-15}$ s and $10^{-7}$ s, and with laser wavelengths between 248-535 nm.

In an embodiment, the patterning process for forming second discrete opening 528 and third discrete opening 530 can be performed in the same or single operation (e.g., using a laser in a same or a single laser processing chamber) or, alternatively, can be performed separately (e.g., separate laser patterning processes can be used to form contact openings in the first insulator layer and second insulator layer).

In an embodiment, the doping source layer 524 and the anti-reflective coating layer 526 can be configured to be highly absorptive over the opening 516 and highly reflective over the regions outside the opening 516 (e.g., over the semiconductor layer 512) for a particular laser wavelength. In an example, for a green laser (e.g., approximately 532 nm wavelength) the approximate film material (e.g., doping source layer 524 and/or the anti-reflective coating layer 526) can be approximately 800 Angstroms over the opening 516 and approximately 1300 Angstroms over the semiconductor layer 512. In one example, for a film material including an oxide nitride stack, then the reflectance minima can be near 532 nm on a P-type contact (e.g., over the opening 516), and the reflectance maxima is on the N-type contact (e.g., over the semiconductor layer 512). In the same example, this can result in a higher laser power required for the N-type contact process (e.g., over the semiconductor layer 512) and a lower laser power for P-type contact process (e.g., over the opening 516), where stray P-contacts (e.g., over the opening 516) that land on an N-finger area (e.g., over the semiconductor layer 512) will not likely open a contact on the more highly reflecting films.

Figure 5E:
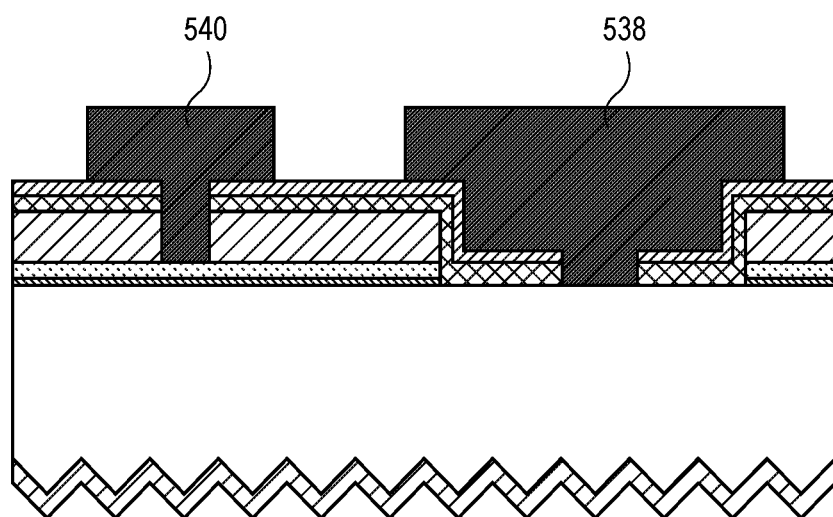

Referring to FIG. 5E, a first conductive contact 538 is formed in the second discrete opening 528 and, if included, on a corresponding doped region of the substrate 502 exposed by the discrete opening 528. In one such embodiment, as is depicted, the first conductive contact 538 is further formed in the first discrete opening 516. In an embodiment, as is also depicted, a second conductive contact 540 is formed in the third discrete opening 530 and on the corresponding exposed discrete portion of the semiconductor layer 512.

In an embodiment, forming the first conductive contact 538 and the second conductive contact 540 can include performing a sputtering process, locally depositing a metal, a blanket deposition process, a plating process, bonding a metal foil and/or bonding wires to first and the second semiconductor layers. In an example, the first conductive contact 538 and the second conductive contact 540 can include a locally deposited aluminum, aluminum foil and/or an aluminum wire. In an embodiment, the first conductive contact 538 and the second conductive contact 540 can include one or more metals and/or metal alloys. In an example, the first conductive contact 538 and the second conductive contact 540 can include aluminum, titanium tungsten and/or copper, among other metals. In an embodiment, the first conductive contact 538 and the second conductive contact 540 can include one, two or more layers of metal. In an example, the first conductive contact 538 and the second conductive contact 540 can include a metal seed layer. In an embodiment, the metal seed layer can include a first layer including copper, a second layer including tungsten and a third layer including aluminum.

In an embodiment, a thermal compression process can be used to electrically connect the first conductive contact 538 and the second conductive contact 540. In an example, a thermal compression process can be used to adhere a wire or a plurality of wires. In one embodiment, first conductive contact 538 and the second conductive contact 540 include a bonded or welded metal foil. In an embodiment, forming the first conductive contact 538 and the second conductive contact 540 can include performing a blanket deposition process. In an example, forming the first conductive contact 538 and the second conductive contact 540 can include performing an electroplating process. In some examples, forming the first conductive contact 538 and the second conductive contact 540 can include performing a blanket deposition process to form a metal seed layer, subsequently plating metals and performing a patterning process to form the first conductive contact 538 and the second conductive contact 540. In an example, forming the first conductive contact 538 and the second conductive contact 540 using a plating process can include placing the substrate in a bath to plate metal to the substrate and form the first and second conductive contacts. In another embodiment, a local metal deposition process can be used to form the first conductive contact 538 and the second conductive contact 540 in one process operation.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein can have application to front contact solar cells as well. In other embodiments, the above described approaches can be applicable to manufacturing of other than solar cells. For example, manufacturing of light emitting diode (LEDs) can benefit from approaches described herein. Furthermore, it is to be appreciated that, where N+ and P+ type doping is described specifically, other embodiments contemplated include the opposite conductivity type, e.g., P+ and N+ type doping, respectively.

Thus, aligned metallization approaches for fabricating solar cells, and the resulting solar cells, have been disclosed. The above structures and techniques can be readily applied and used in solar cell products such as solar cell strings, photovoltaic (PV) laminates and photovoltaic (PV) modules.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

The following examples pertain to further embodiments. The various features of the different embodiments can be variously combined with some features included and others excluded to suit a variety of different applications.

Example embodiment 1: A solar cell includes a semiconductor layer over a semiconductor substrate. A first plurality of discrete openings is in the semiconductor layer and exposes corresponding discrete portions of the semiconductor substrate. A plurality of doped regions is in the semiconductor substrate and corresponds to the first plurality of discrete openings. An insulating layer is over the semiconductor layer and is in the first plurality of discrete openings. A second plurality of discrete openings is in the insulating layer and exposes corresponding portions of the plurality of doped regions. Each one of the second plurality of discrete openings is entirely within a perimeter of a corresponding one of the first plurality of discrete openings. A plurality of conductive contacts is in the second plurality of discrete openings and is on the plurality of doped regions.

Example embodiment 2: The solar cell of example embodiment 1, wherein each of the first plurality of discrete openings is approximately circular, and each of the second plurality of discrete openings is approximately circular.

Example embodiment 3: The solar cell of example embodiment 1 or 2, wherein one or more of the second plurality of discrete openings is centered within a perimeter of a corresponding one or more of the first plurality of discrete openings.

Example embodiment 4: The solar cell of example embodiment 1, 2 or 3, wherein one or more of the second plurality of discrete openings is off-center within a perimeter of a corresponding one or more of the first plurality of discrete openings.

Example embodiment 5: The solar cell of example embodiment 1, 2, 3 or 4, further including a third plurality of discrete openings in the insulating layer exposing corresponding discrete portions of the semiconductor layer, and a second plurality of conductive contacts in the third plurality of discrete openings and on the corresponding discrete portions of the semiconductor layer.

Example embodiment 6: The solar cell of example embodiment 5, wherein the plurality of conductive contacts is a first unidirectional row of conductive contacts, and the second plurality of conductive contacts is a second unidirectional row of conductive contacts parallel with the first unidirectional row of conductive contacts.

Example embodiment 7: The solar cell of example embodiment 1, 2, 3, 4, 5 or 6, wherein the semiconductor layer is on a thin dielectric layer on the substrate, and the first plurality of discrete openings is further in the thin dielectric layer.

Example embodiment 8: The solar cell of example embodiment 1, 2, 3, 4, 5, 6 or 7, wherein the insulating layer is a doping source layer, the solar cell further including a second insulating layer between the semiconductor layer and the doping source layer, wherein the first plurality of discrete openings is further in the second insulating layer.

Example embodiment 9: The solar cell of example embodiment 8, further including an anti-reflective coating layer over the doping source layer, wherein the second plurality of discrete openings is further in the anti-reflective coating layer.

Example embodiment 10: The solar cell of example embodiment 1, 2, 3, 4, 5, 6, 7, 8 or 9, wherein the semiconductor layer has a first conductivity type, and the plurality of doped regions has a second conductivity type opposite the first conductivity type.

Example embodiment 11: A method of fabricating a solar cell includes forming a first plurality of discrete openings in a semiconductor layer above a substrate. The method also includes forming an insulating layer in the first plurality of discrete openings. The method also includes forming a second plurality of discrete openings in the insulating layer using a laser ablation process. Each one of the second plurality of discrete openings is entirely within a perimeter of a corresponding one of the first plurality of discrete openings.

Example embodiment 12: The method of example embodiment 11, wherein forming the first plurality of discrete openings includes using a laser ablation process.

Example embodiment 13: The method of example embodiment 11, wherein forming the first plurality of discrete openings includes using a screen print etch process.

Example embodiment 14: The method of example embodiment 11, 12 or 13, wherein forming the second plurality of discrete openings includes forming one or more of the second plurality of discrete openings centered within a perimeter of a corresponding one or more of the first plurality of discrete openings.

Example embodiment 15: A method of fabricating a solar cell includes forming a semiconductor layer over a semiconductor substrate. The method also includes forming an insulating layer over the semiconductor layer. The method also includes forming a first plurality of discrete openings in the insulating layer and in the semiconductor layer, the first plurality of discrete openings exposing corresponding discrete portions of the semiconductor substrate. The method also includes forming a doping source layer over the insulating layer and in the first plurality of discrete openings. The method also includes forming a plurality of doped regions in the semiconductor substrate corresponding to the first plurality of discrete openings, the plurality of doped regions formed from the doping source layer. The method also includes forming a second plurality of discrete openings in the doping source layer using a laser ablation process, each one of the second plurality of discrete openings entirely within a perimeter of a corresponding one of the first plurality of discrete openings. The method also includes forming a plurality of conductive contacts in the second plurality of discrete openings and on the plurality of doped regions.

Example embodiment 16: The method of example embodiment 15, wherein forming the first plurality of discrete openings includes using a laser ablation process.

Example embodiment 17: The method of example embodiment 15, wherein forming the first plurality of discrete openings includes using a screen print etch process.

Example embodiment 18: The method of example embodiment 15, 16 or 17, further including forming a third plurality of discrete openings in the doping source layer and the insulating layer exposing corresponding discrete portions of the semiconductor layer, and forming a second plurality of conductive contacts in the third plurality of discrete openings and on the corresponding discrete portions of the semiconductor layer.

Example embodiment 19: The method of example embodiment 15, 16, 17 or 18, wherein forming the second plurality of discrete openings includes forming one or more of the second plurality of discrete openings centered within a perimeter of a corresponding one or more of the first plurality of discrete openings.

Example embodiment 20: The method of example embodiment 15, 16, 17, 18 or 19, wherein forming the second plurality of discrete openings includes forming one or more of the second plurality of discrete openings off-center within a perimeter of a corresponding one or more of the first plurality of discrete openings.

Although exemplary embodiments are presented above, another exemplary embodiment of the present disclosure is presented below.

In embodiments, a solar cell includes a semiconductor layer over a semiconductor substrate. A continuous opening is in the semiconductor layer and exposes a corresponding continuous portion of the semiconductor substrate. Doped regions can be located in the semiconductor substrate and correspond to the continuous opening. An insulating layer can be over the semiconductor layer and is in the continuous opening. Other openings in the insulating layer can expose corresponding portions of the doped regions. Each of these openings in the insulating layer can be entirely within a perimeter of a corresponding continuous opening. A plurality of conductive contacts is in continuous opening and is on the doped regions.

In an example, a continuous opening can include a non-discrete structure and/or opening. In some examples, the continuous opening can include a line, a rectangular shape, overlapping circular or oblong shape openings, among other shapes. In an example, the continuous opening can include an opening that has at least twice the area of a discrete opening, e.g., a discrete opening described above. In an example, a continuous opening can cover a substantial portion of a solar cell doped region without gaps and/or breaks throughout. In an example, a continuous opening can include discrete openings with overlapping portions, e.g., forming a continuous opening that includes circular, oblong, triangular, trapezoidal, polygon, oval shape and/or any other type of shapes can be used, e.g., with overlapping portions.

Also disclosed herein are methods of fabricating solar cells. In one embodiment, a method of fabricating a solar cell includes forming a continuous opening in a semiconductor layer above a substrate. The method also includes forming an insulating layer in the continuous opening. The method also includes forming a plurality of discrete openings in the insulating layer using a laser ablation process. Each one of the plurality of discrete openings is entirely within a perimeter of a corresponding the continuous opening.

Figure 6:
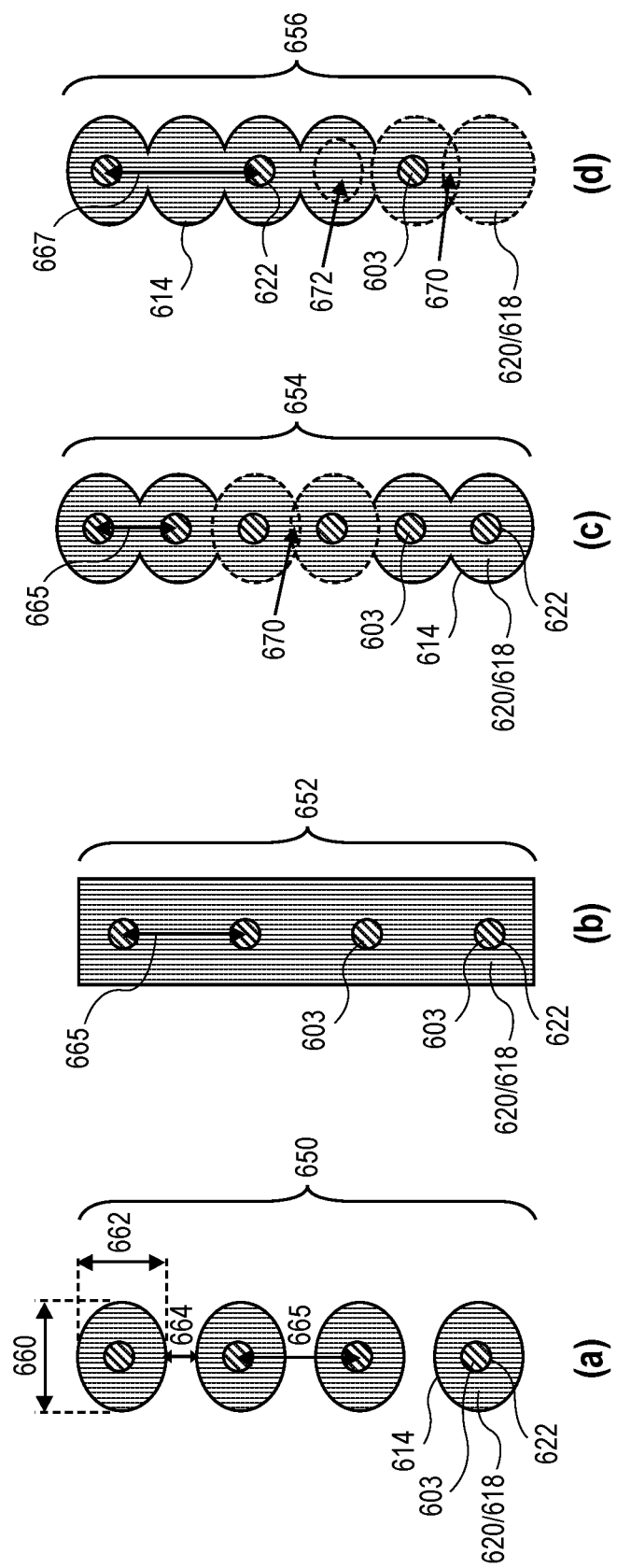
FIG. 6 illustrates plan views representing various aligned metallization structures for a solar cell, in accordance with an embodiment of the present disclosure.

Referring to FIG. 6, plan views (a) to (d) show representing various aligned metallization structures for a solar cell. For reference, FIG. 6 (a) is a replicate of the Plan View of FIG. 1 for comparison. FIGS. 6 (b) to (d) show exemplary continuous openings, e.g., in contrast to the discrete openings shown in FIG. 1 and FIG. 6 (a), as is described below.

Referring to FIG. 6 (a), a plurality of discrete openings 650 are shown. In an embodiment, FIG. 6 (a) shows a similar structure, e.g., the same structure, to that shown in the Plan View of FIG. 1, where similar reference numbers refer to the same or similar elements described in FIG. 1 (e.g., with an increased increment number of +500 from 100s to 600s to represent FIG. 6). In an example, a first plurality of discrete openings 614 can correspond to the plurality of discrete openings 114 of FIG. 1. In another example, discrete portions/doped regions 603 within the first plurality of discrete openings 614 can correspond to the discrete portions/doped regions 103 of FIG. 1.

Referring again to FIG. 6 (a), in an embodiment the individual size, e.g., length/diameter 660, 662 of a discrete opening 614 can be approximately less than 150 µm. In one example, the length of one side 660 can equal to the length of another side 662. In another example, the length of the side 660 can be approximately greater than the length of the side 662. In still another example, the length of the side 662 can be approximately greater than the length of the side 660. In an example, the length of the side 660 can be approximately less than 150 µm while the length of the side 662 can be approximately less than 100 µm. In an embodiment, the edge-to-edge distance 664 that separates discrete openings 614 can be approximately less than 100 µm. In some examples, the edge-to-edge distance 664 that separates discrete openings 614 can be approximately less than 100 µm and approximately greater than 50 µm. In an embodiment, a distance 665 between one of the plurality of discrete openings 622 to another opening can be approximately less than 200 µm. In an embodiment, the distance 665 between one of the plurality of discrete openings 622 to another opening can be approximately less than 200 µm and approximately greater than 150 µm.

As described above and below, FIGS. 6 (b) to (d) show alternative structures to those shown in FIG. 1 and FIG. 6 (a), where like numbers and description can refer to the same or similar structures, and where the structures described in FIGS. 6 (b) to (d) can be used interchangeably with like or similar structures found in FIG. 1 and FIG. 6 (a).

Referring to FIG. 6 (b), an example for a first continuous opening 652 is shown. The first continuous openings 652 is in a semiconductor layer and exposes corresponding discrete portions/doped regions 603 of a semiconductor substrate (e.g., referring to 112, 102 of FIG. 1). An insulating layer 618 and/or an anti-reflective layer 620 is over the semiconductor layer and is in the first continuous opening 654. A plurality of discrete openings 622 is in the insulating layer 618/anti-reflective layer 620 and exposes corresponding portions of doped regions 103. In an embodiment, the distance 665 between one of the plurality of discrete openings 622 to another opening can be approximately less than 200 µm. In an embodiment, a plurality of conductive contacts can be in the first continuous opening 652 and is on the plurality of doped regions 603. In an embodiment, the first continuous opening can include a rectangular shape as shown, among other shapes such as oblong, triangular, trapezoidal, polygon, oval shape and/or any other type of shapes.

Referring to FIG. 6 (c), an example for a second continuous opening 654 is shown. In an embodiment, FIG. 6 (c) shows a similar structure, e.g., the same structure, to that shown in FIG. 6 (b), where similar reference numbers refer to the same or similar elements described in FIG. 6 (b). In an embodiment, the second continuous opening 654 can include a first plurality of discrete openings 614 with overlapping portions 670, e.g., forming the second continuous opening 654. In an embodiment, the first plurality of discrete openings 614 of the second continuous opening 654 can include circular, oblong, square, etc. shaped openings (e.g., circular, oblong, square, etc.) with overlapping portions 670. In an embodiment, the overlap 670 can include less than 50% of the total area if the opening were to be a discrete opening. In an embodiment, a plurality of conductive contacts can be in the second continuous opening 654 and is on the plurality of doped regions 603.

Referring to FIG. 6 (d), an example for a third continuous opening 656 is shown. In an embodiment, FIG. 6 (d) shows a similar structure to that shown in FIG. 6 (c) and FIG. 6 (b), where similar reference numbers refer to the same or similar elements described in FIG. 6 (c) and FIG. 6 (b). In an example, the third continuous opening 656 is substantially similar to the second continuous opening 654 of FIG. 6 (c) with the exception that the plurality of openings 622 are farther spaced apart. In an example, the third continuous opening 656 can include a first plurality of discrete openings 614 with overlapping portions 670, e.g., forming the third continuous opening 656. In an embodiment, the distance 667 between one of the plurality of discrete openings 622 to another opening can be approximately less than 400 µm. In an embodiment, the distance 667 between one of the plurality of discrete openings 622 to another opening can be approximately less than 400 µm and approximately greater than 200 µm. As shown, the third continuous opening 656 can include portions 672 without one of the openings 622. In an example, in comparison to the second continuous opening 654 of FIG. 6 (c), the portions 672 without an opening 622 can be at locations between openings 622 at one of the plurality of discrete openings 614, as shown in FIG. 6 (d).

The advantages of using such embodiments described in FIGS. 6 (a) to (d) can include improved carrier lifetime and reduced solar cell series resistance. For example, a solar cell having the configuration shown in FIG. 6 (a) can have improved carrier lifetime as compared to FIGS. 6 (b) and (d) due to, in one example, having less p+ doped region in an n+ silicon substrate compared to a solar cell having a similar configuration as FIGS. 6 (b) and (d). In one example, a solar cell having the configuration shown in FIG. 6 (a) can have reduced series resistance as compared to a solar cell using the configuration of FIG. 6 (c) due to, in one example, having less p+ contact area. Although one configuration of FIGS. 6 (a) to (d) can have an advantage over another configuration, in an example, each configuration allowed for can reduced process operations to fabricate a solar cells while maintaining a high cell efficiency. Such configurations can combine a low lifetime p++c-Si emitter region with a high lifetime N-poly emitter, by adjusting in one example, the p+ area as small as possible, ideally lower than 2% of wafer coverage.

What is claimed is:

1. A method of fabricating a solar cell, the method comprising:

forming a first plurality of discrete openings in a semiconductor layer above a semiconductor substrate, the first plurality of discrete openings exposing corresponding discrete portions of the semiconductor substrate, wherein all adjacent openings of the first plurality of discrete openings have an overlap;

forming an insulating layer in the first plurality of discrete openings; and forming a second plurality of discrete openings in the insulating layer using a laser ablation process, each one of the second plurality of discrete openings entirely within a perimeter of a corresponding one of the first plurality of discrete openings and entirely outside of a perimeter of both of the adjacent openings of the first plurality of discrete openings that overlap with the corresponding one of the first plurality of discrete openings.

2. The method of claim 1, wherein forming the first plurality of discrete openings comprises using a laser ablation process.

3. The method of claim 1, wherein forming the first plurality of discrete openings comprises using a screen print etch process.

4. The method of claim 1, wherein forming the second plurality of discrete openings comprises forming one or more of the second plurality of discrete openings centered within a perimeter of a corresponding one or more of the first plurality of discrete openings.

5. A method of fabricating a solar cell, the method comprising:

forming a semiconductor layer over a semiconductor substrate;

forming an insulating layer over the semiconductor layer;

forming a first plurality of discrete openings in the insulating layer and in the semiconductor layer, the first plurality of discrete openings exposing corresponding discrete portions of the semiconductor substrate, wherein all adjacent openings of the first plurality of discrete openings have an overlap;

forming a doping source layer over the insulating layer and in the first plurality of discrete openings;

forming a plurality of doped regions in the semiconductor substrate corresponding to the first plurality of discrete openings, the plurality of doped regions formed from the doping source layer;

forming a second plurality of discrete openings in the doping source layer using a laser ablation process, each one of the second plurality of discrete openings entirely within a perimeter of a corresponding one of the first plurality of discrete openings and entirely outside of a perimeter of both of the adjacent openings of the first plurality of discrete openings that overlap with the corresponding one of the first plurality of discrete openings; and forming a plurality of conductive contacts in the second plurality of discrete openings and on the plurality of doped regions.

6. The method of claim 5, wherein forming the first plurality of discrete openings comprises using a laser ablation process.

7. The method of claim 5, wherein forming the first plurality of discrete openings comprises using a screen print etch process.

8. The method of claim 5, further comprising:

forming a third plurality of discrete openings in the doping source layer and the insulating layer exposing corresponding discrete portions of the semiconductor layer; and forming a second plurality of conductive contacts in the third plurality of discrete openings and on the corresponding discrete portions of the semiconductor layer.

9. The method of claim 5, wherein forming the second plurality of discrete openings comprises forming one or more of the second plurality of discrete openings centered within a perimeter of a corresponding one or more of the first plurality of discrete openings.

10. The method of claim 5, wherein forming the second plurality of discrete openings comprises forming one or more of the second plurality of discrete openings off-center within a perimeter of a corresponding one or more of the first plurality of discrete openings.

* * * * *